United States Patent
Svilans

(10) Patent No.: US 6,222,200 B1
(45) Date of Patent: Apr. 24, 2001

(54) PHOTODETECTOR WITH SPECTRALLY EXTENDED RESPONSIVITY

(75) Inventor: Mikelis Nils Svilans, Kanata (CA)

(73) Assignee: Nortel Networks Limited, Montreal (CA)

(*) Notice: Subject to any disclaimer, the term of this patent is extended or adjusted under 35 U.S.C. 154(b) by 0 days.

(21) Appl. No.: 09/294,114

(22) Filed: Apr. 19, 1999

(51) Int. Cl.$^7$ .......................... H01L 29/06; H01L 31/072

(52) U.S. Cl. .................. 257/18; 257/21; 257/22; 257/185; 257/186; 257/190

(58) Field of Search ................ 257/15, 17, 18, 257/21, 22, 186, 185, 191, 190

(56) References Cited

U.S. PATENT DOCUMENTS

| | | | |
|---|---|---|---|
| 4,711,857 | 12/1987 | Cheng | 437/3 |
| 5,536,948 | 7/1996 | Lee | 257/17 |
| 5,574,289 | 11/1996 | Aoki et al. | 257/17 |
| 5,608,230 | 3/1997 | Hirayama et al. | 257/18 |

OTHER PUBLICATIONS

"Characterization of Process–Induced Defects in 2.6 μm InGaAs Photodiodes", Ban, et al., SPIE, vol. 1985, pp. 234–242.

"Study of RTS Noise and Excess Currents in Lattice–Mismatched InP/InGaAs/InP Photodetector Arrays", *Solid–State Electronics*, vol. 38, No. 1, 1995, pp. 37–49.

"2.6 μm InGaAs Photodiodes", Martinelli, et al., Appl. Phys. Lett. 53 (11), Sep. 12, 1988, pp. 989–991.

"Dark Current Analysis and Characterization of $In_xGa_{1-x}As/InAs_yP_{1-y}$ Graded Photodiodes with x>0.53 for Response to Longer Wavelengths (>1.7 μm)", Linga, et al., Journal of Lightwave Technology, vol. 10, No. 8, Aug. 1992, pp. 1050–1054.

*Primary Examiner*—Minh Loan Tran
(74) *Attorney, Agent, or Firm*—Victoria Donnelly

(57) ABSTRACT

A photodetector has an extended wavelength range combined with high responsivity and reliability. It includes an active region having alternating compressive and tensile strain layers arranged so that the total effective strain of the active region is balanced. The thickness of each layer is limited so that a product of a thickness by strain is not exceeding about 20% nm to avoid formation of crystalline defects. The layers with higher optical absorption constant are made thicker than the layers with lower absorption constant to provide the required responsivity of the detector. In one embodiment, the active region is formed on InP substrate and includes alternating 0.25% compressive strain and 1.03% tensile strain layers of InGaAs composition, the compressive strain layers being approximately four times thicker. In another embodiment interfaces between the layers are compositionally graded. The described structure of the active region may be used in various types of photodetectors, e.g., PIN, APD, MSM, Shottky barrier and waveguide photodetectors. Depending on the materials used, the photodetector is capable of operating in a wide wavelength range, e.g. up to 2200 nm, and covering a wide range of temperatures, including cryogenic temperatures.

32 Claims, 7 Drawing Sheets

PHOTODETECTOR WITH SPECTRALLY EXTENDED RESPONSIVITY

FIELD OF THE INVENTION

The invention relates to photodetectors, and in particular to photodetectors with extended wavelength range.

BACKGROUND OF THE INVENTION

In recent years, there has been a considerable interest in optical fiber communication systems operating in the long wavelength range. This is of particular interest because of the need to increase the capacity of present wavelength division multiplex (WDM) systems by adding channels at longer wavelengths. For example, it was shown that by utilizing a spectrum range up to 1602 nm only, the number of channels can be more than doubled.

Market trends to longer wavelengths create an immediate need for optical photodetectors operable within an extended wavelength range. Photodetectors are spectrally limited on the long wavelength side by the bandgap of semiconductor material which is used as an active region. As a result, most widely used photodetectors based on InGaAs exhibit a decrease in responsivity as the operating wavelength is extended beyond approximately 1580–1600 nm.

Numerous attempts have been made to extend a wavelength range of photodetectors. One of them is to maintain photodetectors at elevated temperatures to reduce their bandgaps and thus to extend spectral responsivities. This approach has a number of drawbacks, namely the reduction of material bandgap is accompanied by high leakage current, which increases exponentially with temperature, shortened device lifetime and increased thermal loading on the system. In another approach, by applying strain in the active region, the bandgap of the material can be reduced. In the case of the InGaAs telecom photodetector, for example, strain is avoided by growing the active layer such that its crystalline lattice constant is matched to the InP substrate. By adjusting the $In_xGa_{1-x}As$ composition x, layers with larger or smaller lattice constant can be grown, which results in compressive or tensile strain when the layers get deposited on InP. However, the thickness of layers that can be grown without introducing substantial crystalline defects is limited to well known values which depend on the magnitude of the strain. Exceeding such thickness limits causes formation of crystalline defects which can degrade the device performance by increasing the leakage current and limiting its lifetime, see e.g. publication by V. S. Ban, A. M Joshi and N. B. Urli "Characterization of process-induced defects in 2.6 $\mu$m InGaAs photodiodes", SPIE, Vol. 1985, pp. 234–243, 1993. Noise can also be increased, as shown, e.g. in publication by D. Pogany, S. Ababou, G. Guillot et. al. "Study of RTS Noise and Excess Currents in Lattice-Mismatched InP/InGaAs/InP Photodetector Arrays", Solid State Electronics, Vol. 38, No. 1, pp. 37–49, 1995. For strain values of interest, the thickness of substantially defect free layers is generally not sufficient to attain the required responsivity specifications of the photodetector. When layers exceeding the defect free thickness are grown, they become mismatched with the substrate, and mismatch disclocations as well as crystalline defects are introduced. Though lattice mismatched devices are available on the market, they have prohibitively high leakage currents for telecom receiver application. The examples of lattice mismatched photodetectors along with discussions of the associated problems may be found in the following publications: K. R. Linga, G. H. Olsen, V. S.Ban et.al. "Dark Current Analysis and Characterization of $In_xGa_{1-x}As/InAs_yP_{1-y}$ Graded Photodiodes with x>0.53 for Response to Longer Wavelengths(>1.7 $\mu$m)", Journal of Lightwave Technology, Vol. 10, No. 8, pp. 1050–1054, August 1992; R. U. Martinelli, T. J. Zamerowski and P. A. Longway "2.6 $\mu$m InGaAs photodiodes", Applied Physics Letters, vol. 53, No. 11, pp. 989–991, September 1988. Other II–VI and III–V compound semiconductors materials are also available on the market, but their process maturity and performance is somewhat inferior to the requirements of fiberoptic system specifications. In one more approach a sandwiched structure of the active region of the photodetector has been proposed, where layers with different strain interleave, thus allowing to improve some other deteriorating characteristics of the detectors. For example, in U.S. Pat. No. 5,608,230 a target is to reduce a relatively large dark current of the detector, while U.S. Pat. No. 5,536,948 aims to mitigate defect propagation from the base layer to the detector elements. U.S. Pat. No. 4,711,857 to Cheng provides a superlattice detector whose wavelength sensitivity is tunable during manufacturing of the device, and U.S. Pat. No. 5,574,289 to Aoki concentrates on the detector suitable for light signals having different polarizations.

As it follows from the above discussion, an extension of a wavelength range is usually achieved at the expense of deterioration of other important parameters of the photodetectors which remains a significant problem in fiber optic systems.

Accordingly, there is a need for development of alternative structures of optical photodetectors which would provide an operation within an extended wavelength range, while maintaining high performance and reliability.

SUMMARY OF THE INVENTION

It is therefore an object of the invention to provide a photodetector having an extended wavelength range while maintaining high performance and reliability.

According to one aspect of the present invention there is provided a photodetector comprising:

a) a substrate;

b) an active region formed on the substrate, the active region comprising:
  a plurality of semiconductor layers, the thickness of each layer being limited to preclude formation of crystalline defects,
  the total effective strain of the active region being balanced, wherein the effective strain is defined as a product of strain by thickness of the layer,
  the thicknesses of the layers being optimized to provide a pre-determined optical absorption over a required wavelength range; and c) means for providing depletion of the active region of electric charge carriers.

Preferably, the thicknesses of the layers is optimized to provide a maximum optical absorption over the required range of wavelengths. Advantageously, the layers with higher optical absorption constant are made thicker than the layers with lower optical absorption constant to provide sufficient responsivity of the photodetector.

Beneficially, the active region of the photodetector comprises a plurality of alternating layers, placed under compressive and tensile strain correspondingly, the layers with higher optical absorption constant having higher thickness than the layers with lower optical absorption constant.

In one embodiment, the active region is formed on InP substrate and includes alternating compressive and tensile strain layers made of InGaAs composition, the compressive strain layers having higher absorption and correspondingly higher thickness. The photodetector of this embodiment provides operation within a wavelength range from about 970 nm to about 1800 nm. In modifications to this embodiment, the active region may be formed on InP substrate and include alternating compressive strain InGaAs layers and tensile strain Ge layers. Such a photodetector may operate within a wavelength range from about 970 nm to about 2000 nm. With other suitable materials used for the active region, it is possible to extend a long wavelength operation even further, e.g. up to about 2200 nm.

To preclude formation of crystalline defects, e.g. misfit disclocations, the thickness of each layer is limited so that a product of strain by thickness of the layer would not exceed about 20% nm.

In another embodiment of the invention, interfaces between the layers are compositionally graded. The interfaces between the layers may be graded either continuously or by forming an interstitial grade layer or several layers. If required, the interfaces, following the compressive strain layers, may be graded only, or alternatively, the grading may be provided at the interfaces, following the tensile strain layers only.

Preferably, means for providing depletion of the active region of electric charge carriers comprises electrical contacts for applying an electric field to the active region. It is conveniently made by forming a cap layer above the active region, and providing the electrical contacts to the cap layer and to the substrate.

The structure of the active region described above may be used in various types of photodetectors, e.g. PIN photodetector, avalanche photodetector (APD), waveguide photodetector, Shottky barrier or metal-semiconductor-metal (MSM) photodetector.

Depending on the materials used and applications applied, the described photodetector is capable of operating in a wide range of temperatures, including cryogenic temperatures. Some typical examples may include temperature ranges at about room temperatures, below about room temperatures (e.g. from about 0° C. to about −40° C., or from about −40° C. to about −85° C.), above about room temperatures (e.g. up to about 70° C.).

The photodetector of the present invention may be used for different purposes, e.g. as a receiver diode or back facet monitor (BFM). The photodetector is also suitable for a variety of applications, e.g. telecommunications, aerospace industry, astronomy, cryogenics, lasers and medical applications, the above list being not exhaustive.

Optical photodetectors having the structure described above provide an extended wavelength range combined with high responsivity and low defect concentration, and as a result the photodetectors have low leakage currents, long life time and high reliability.

BRIEF DESCRIPTION OF THE DRAWINGS

The invention will now be described in greater detail with references to the attached drawings wherein:

FIG. 7b illustrates a continuous composition grading between the layers of the active region of FIG. 7a.

DETAILED DESCRIPTION OF THE PREFERRED EMBODIMENTS

Figure 1:
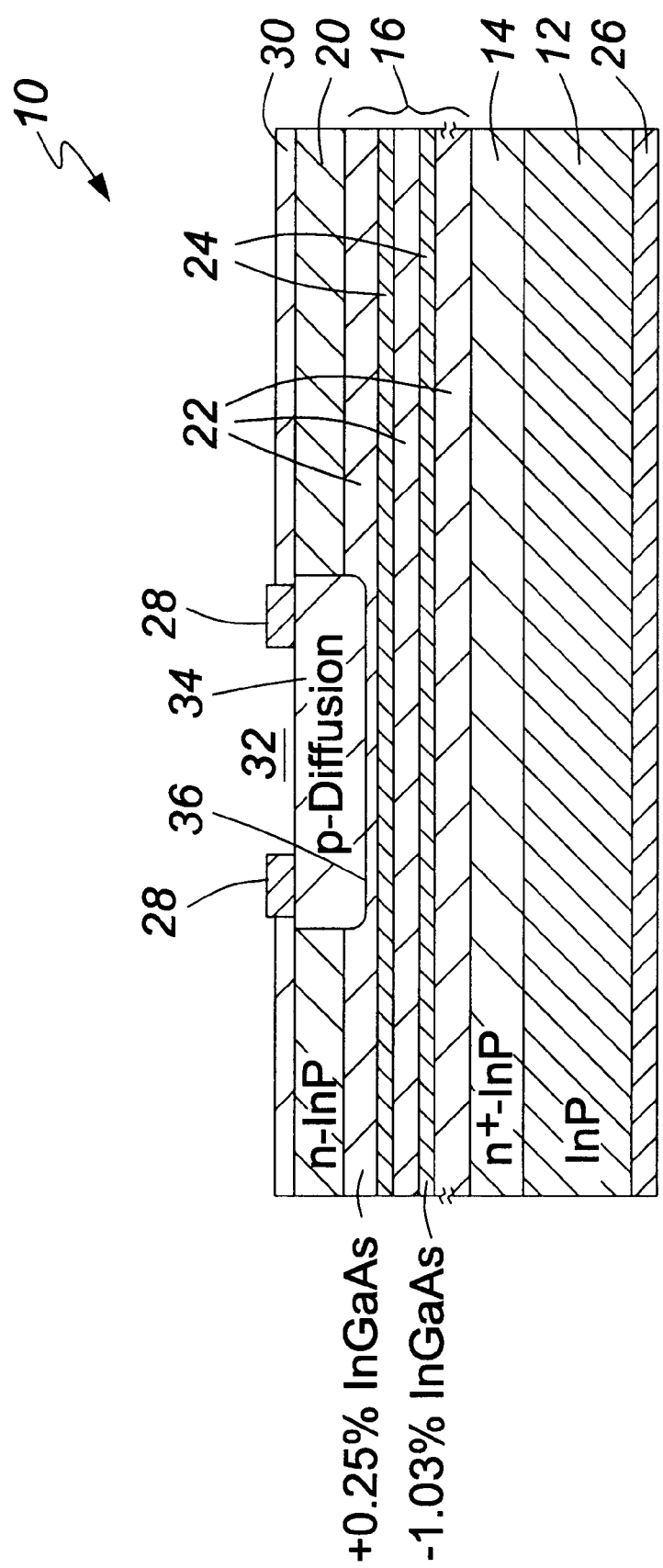
FIG. 1 is a schematic cross section through a photodetector according to a first embodiment of the invention.

A schematic cross section through a photodetector 10 according to a first embodiment of the present invention is shown in FIG. 1.

The photodetector 10 comprises a substrate 12 providing a buffer layer 14 and an active region 16 formed thereon which is followed by an overlying cap layer 20. The active region 16 comprises a plurality of semiconductor layers 22, 24, the thickness of each layer being limited to preclude formation of crystalline defects. The layers 22, placed under compressive strain and having the lowest energy bandgap, interleave with tensile strain layers 24 so that the total effective strain of the active region is balanced, i.e. the effective compressive layers and tensile layers strain is compensated. The effective strain for a particular layer is defined as a product of strain of the layer by its thickness. The layers having higher optical absorption constant are made thicker to provide a required optical absorption over a pre-determined wavelength range which ensures the required responsivity of the photodetector. Means for depletion of the active region 16 of electric carriers are formed as electrical contacts to the substrate 12 (bottom electrode 26) and to the cap layer 20 (top electrodes 28).

Figure 2:
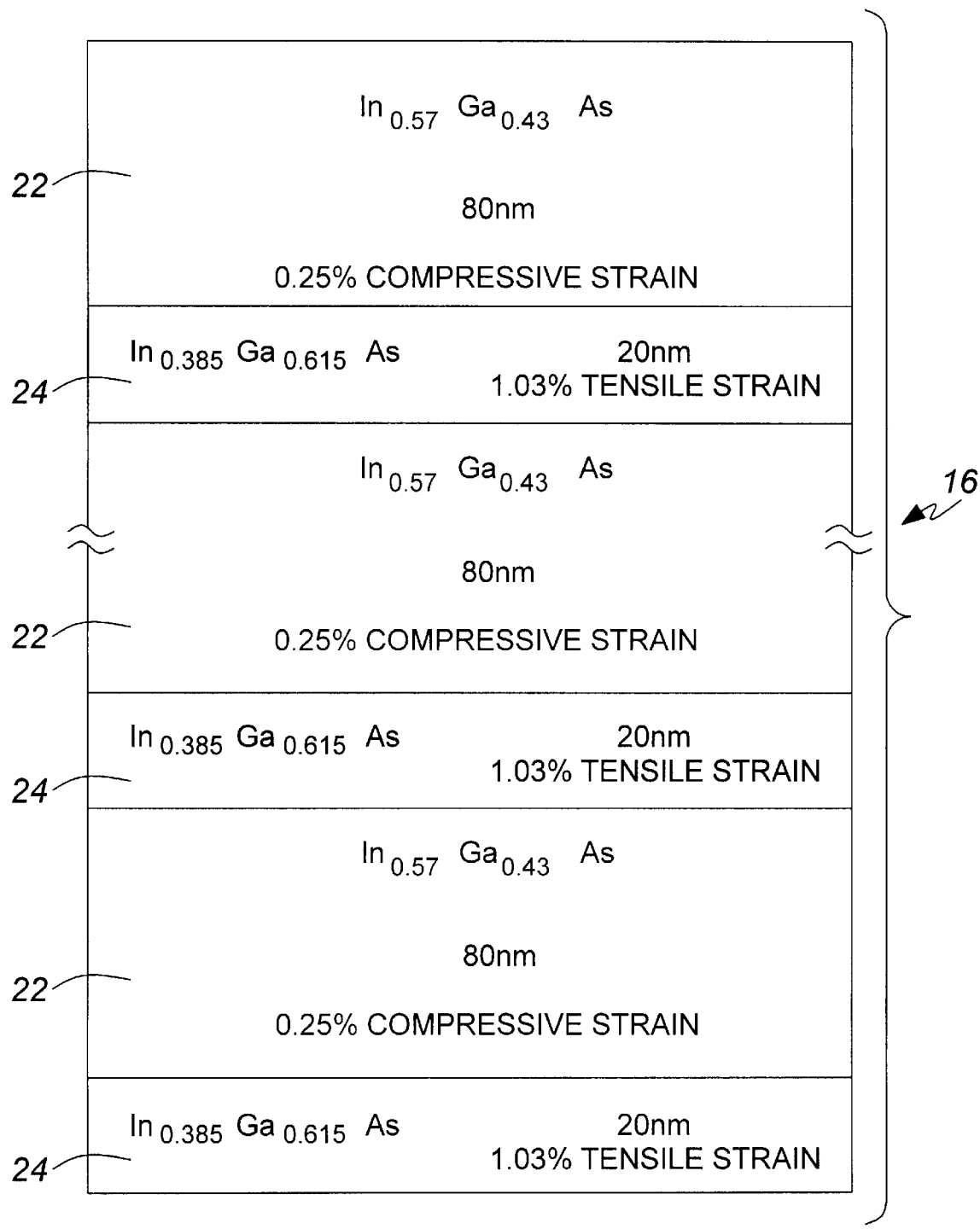
FIG. 2 is a schematic cross section through the active region of the photodetector of FIG. 1.

The structure of the photodetector 10 will be described in more detail below with references to FIGS. 1 and 2, where FIG. 2 shows a detailed structure of the active layer 16.

The photodetector 10 is fabricated from Group III–V semiconductor materials, and comprises a highly doped n-doped InP substrate 12, on which a highly $n^+$-doped InP buffer layer 14 of 1.0 $\mu$m thickness is defined. The active region 16 overlies the buffer layer 14 and comprises of fifteen pairs of nominally undoped indium gallium arsenide layers alternating in composition and thickness. Each pair is comprised of a 0.25% compressive strain $In_{0.57}Ga_{0.43}As$ layer 22 having thickness of 80 nm with a bandgap of 0.726 eV corresponding to 1.708 nm, and a 1.03% tensile strain $In_{0.385}Ga_{0.615}As$ layer having thickness of 20 nm with a bandgap of 0.855 eV corresponding to 1.450 $\mu$m. To avoid formation of crystalline defects, the thickness of each layer is limited so that the effective strain would not exceed about 20% nm. When balancing the effective strain, the absorption characteristics of the materials are taken into account, namely, the layers 22 having higher absorption constant are made thicker than the layers 24 having lower absorption constant over a required wavelength range.

The InP cap layer 20 of 1.2 micrometer thickness, formed on top of the active layer 16, expedites the attachment of top electrical contacts 28 and reduces surface recombination effects which tend to increase leakage current of the device.

When the epitaxial growth is complete, a dielectric coating 30 is applied, generally being selected from $SiO_2$ or $SiN_x$. An opening 32 is etched into the dielectric layer, which acts as a mask during the diffusion process which follows. A p-type dopant 34, being usually zinc (Zn), is then diffused into the surface of the uncovered portions of the cap layer 20 and into the active layer 16 by about 0.1 micrometer to form the p-n junction 36.

To apply the electric field necessary to deplete the active layer of electric charge carriers (electrons and holes), the top metal electrode 28 is evaporated onto the p-type region on top of the diffused area 34, and the bottom electrode 26 is evaporated onto the n-type region on the bottom of the substrate 12 respectively. As mentioned above, the top (p−) electrode 28 has an opening 32 through which the optical signal can be introduced for detection. Conversely, the bottom (n−) electrode 26 may have the opening to allow rear entry of the optical signal (not shown).

For the prevention of unnecessary optical signal losses to the photodetector by reflection of the entry surfaces, dielectric coatings of suitable composition and thickness can be applied to interferometrically reduce the surface reflectivity, e.g. anti-reflection (AR) coating (not shown in diagrams for clarity).

The structure 10 described above may be grown by metal-organic vapour phase epitaxy (MOVPE), molecular beam epitaxy (MBE) or other suitable methods known in semiconductor industry.

Figure 3:
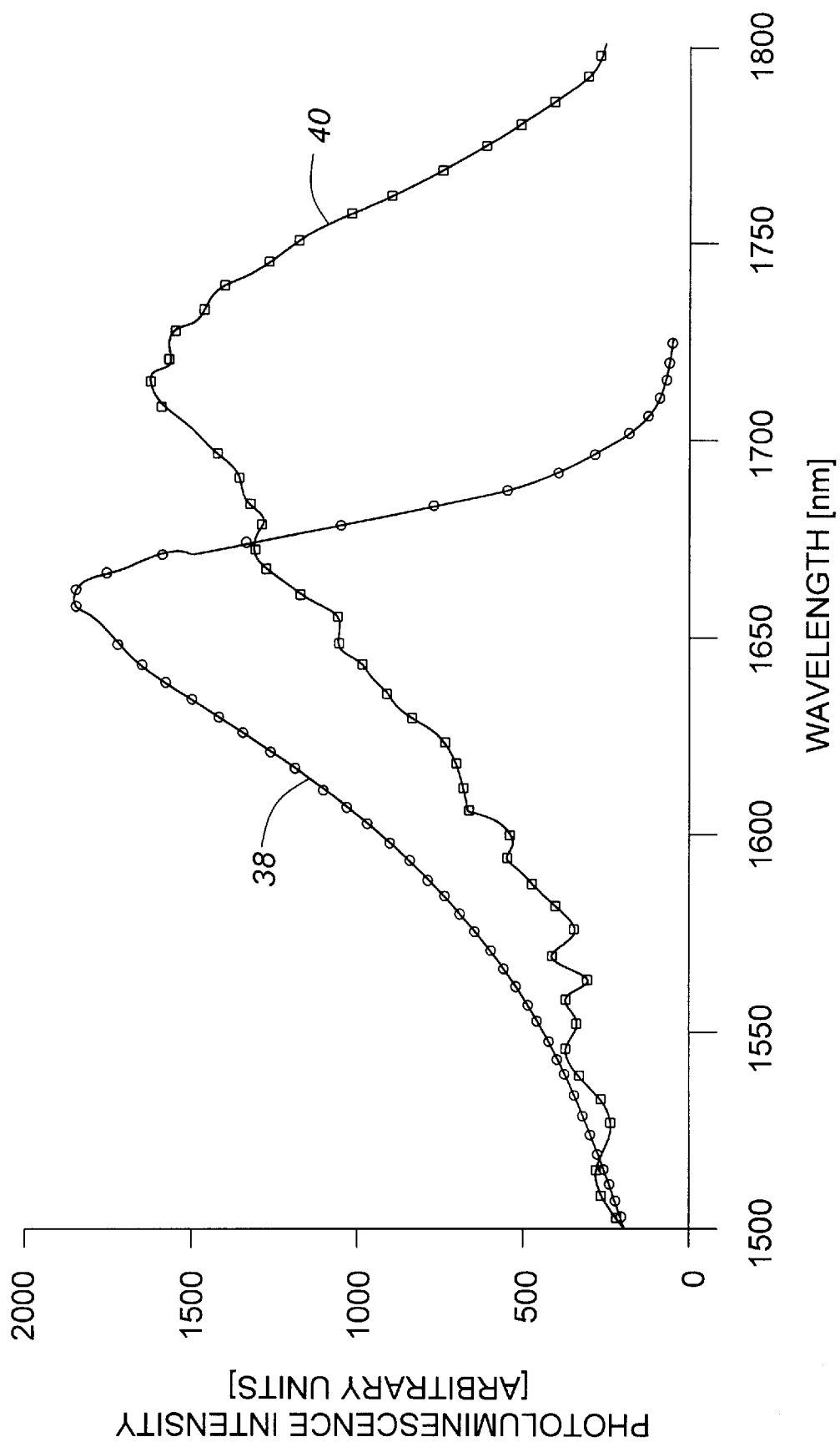
FIG. 3 shows photoluminescence spectra of the photodetector of FIG. 1 and a standard photodetector available in the industry.

Active region 16 grown as described above has been tested by photoluminescence (PL) to verify the predominant band-gap of the semiconductor system. Photoluminescence (PL) is a commonly used method in the optoelectronics industry to measure semiconductor material bandgap which is very close to the photon energy corresponding to the PL peak. From the absolute magnitude of the peak as well as its width, conclusions are usually drawn about the crystalline quality and homogeneity of the material. Typical measured PL spectra of the detector 10 and a standard photodetector available in industry are shown in FIG. 3. Curve 38 corresponds to a PL spectrum of a standard unstrained lattice matched $In_{0.53}Ga_{0.47}As$ photodetector formed on InP substrate, the detector being most commonly used in telecom applications. Curve 40 corresponds to a PL spectrum of a 0.25% strained InGaAs photodetector 10 of the first embodiment of the invention described above. As follows from FIG. 3, a shift of about 50 nm between the curves 38 and 40 takes place, i.e. the 0.25% strained InGaAs spectrum extends further with respect to the unstrained case. It is also to be noted that the curve 40 has a slightly broader peak compared to the curve 38. The increased peak width, as well as the slight undulations in the case of the photodetector 10 can be ascribed mostly to the multilayer (superlattice) structure as well as to the presence of essentially two compressively strained materials, the material with longer wavelength predominating quantitatively. It is seen from FIG. 3 that the active region 16 material is of good quality, being suitable for the photodetector application.

Figure 4:
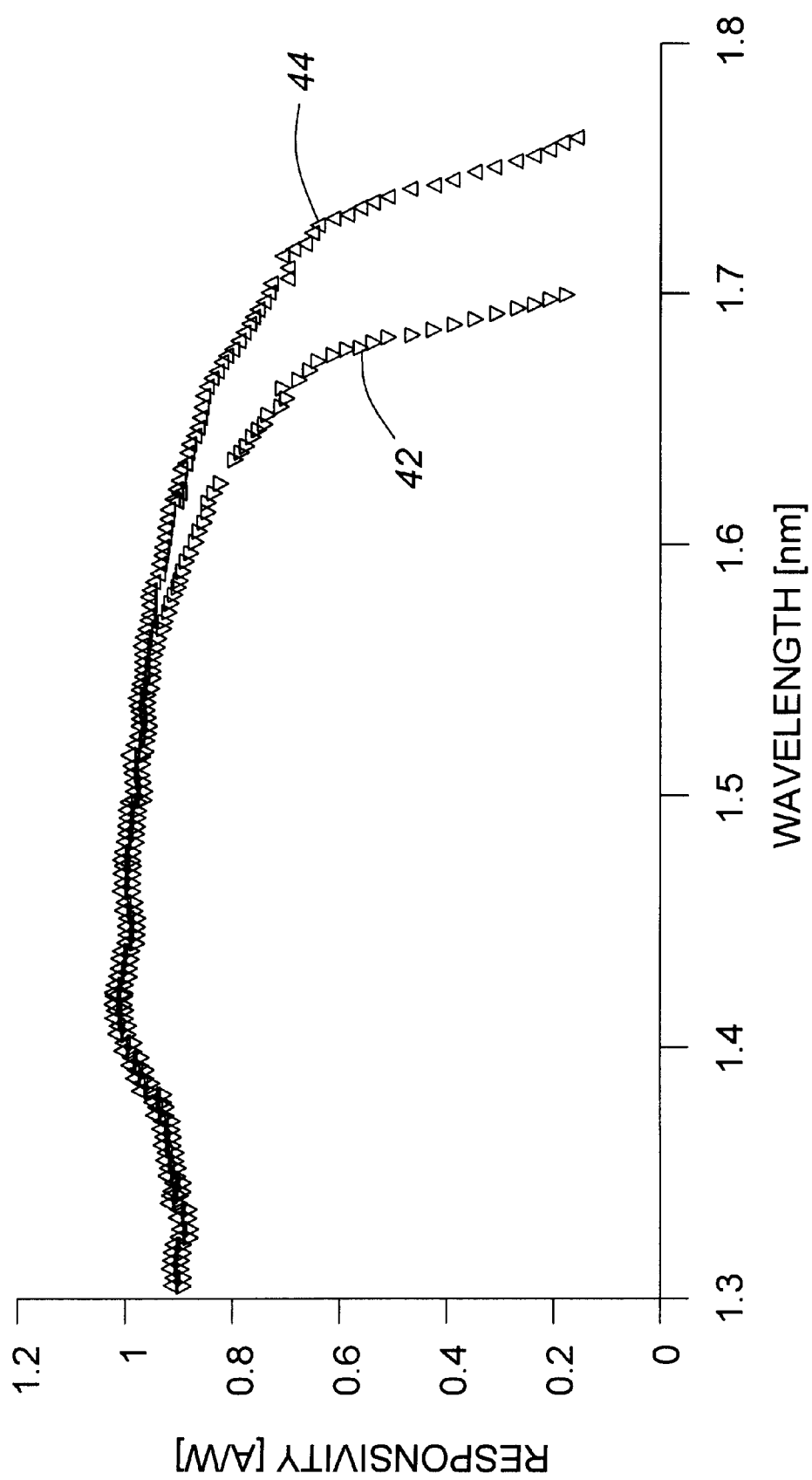
FIG. 4 shows responsivity spectra of the photodetector of FIG. 1 and standard photodetector available in the industry.

FIG. 4 shows responsivity spectra of the photodetector 10 of the first embodiments of the invention (curve 44) and the standard lattice matched InGaAs photodetector available in the industry and mentioned above (curve 42). It is confirmed by the results of FIG. 4 that photodetectors fabricated with the structure described in the first embodiment to retain responsivity out to longer wavelengths due to the narrow energy band-gap of the compressively strained material incorporated within the active layer. Plots in FIG. 4 clearly show an approximately 50 nm extension of the responsivity spectrum toward longer wavelengths for the 0.25% strain InGaAs active layer material (curve 44).

Figure 5:
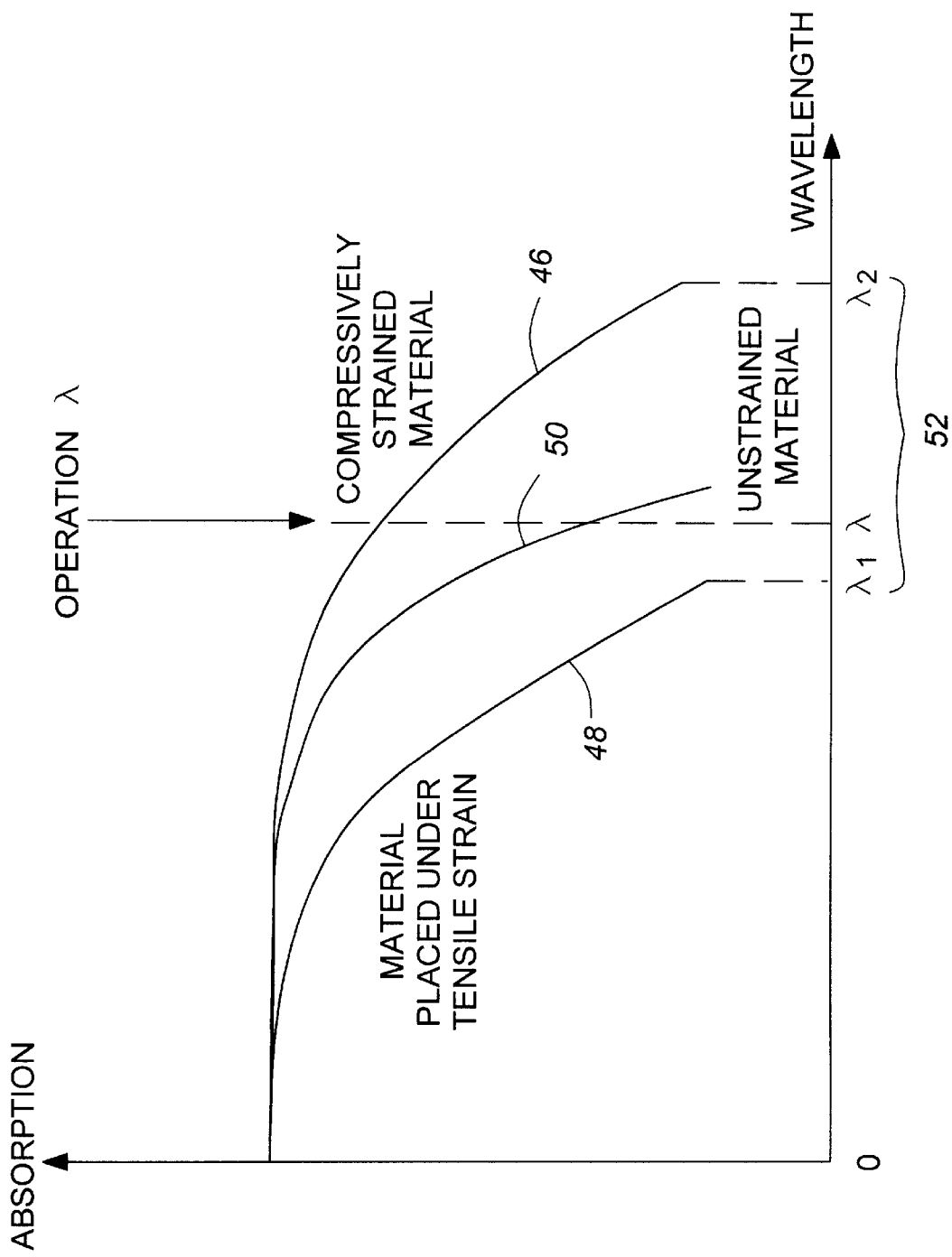
FIG. 5 illustrates typical absorption spectra for unstrained and strained semiconductor material.

The photodetector 10 described above operates in the following manner. It is known that placing a semiconductor composition under compressive strain typically results in shifting the absorption spectrum towards the longer wavelength range as it is qualitatively illustrated in FIG. 5 (curve 46). Accordingly, by applying a tensile strain, the absorption spectrum typically shifts towards the shorter wavelengths (curve 48) in comparison with the unstrained material (curve 50). Therefore, when a photodetector operates at an operating wavelength λ within a wavelength range 52 between the cutoff wavelengths $\lambda_1$ and $\lambda_2$ of the tensile and compressive strain layers respectively, absorption takes place most exclusively within the compressive strain layers 22, while the absorption of the tensile strain layers 24 is negligibly small. Therefore it is beneficial to make the layers with higher absorption constant thicker to provide sufficient responsivity of the photodetector. In the first embodiment of the invention, as shown in FIG. 2, the compressive strain layers of InGaAs are four times thicker than the compressive strain layers, thus ensuring the required responsivity of the photodetector. Similar to other known photodetectors, the photodetector 10 is responsive to incident optical signal (radiation) by a process of converting photons to electron-hole pairs within the active region 16 of the photodetector which is thicker than the radiation penetration depth. The resulting electrons and holes are drawn off as electric current between a pair of top 28 and bottom 26 electrodes located on one or more surfaces of the device. The electrodes are generally also used to apply an electric field within the semiconductor material by means of a p-n junction 36 to increase the speed of the electrons and holes for higher frequency response. The photodetector 10 has been tested within a temperature ranges from about 0° C. to about 55° C., showing high performance characteristics, the above temperature range being not more than an exemplary one.

The photodetector 10 can be fabricated using slightly different composition of $In_xGa_{1-x}As$ material correspondingly different combination of compressive and tensile strain in the material. The results are summarized in table 1. The lattice constants of 6.0583 A, 5.6533 A and 5.8694 A were used for InAs, GaAs and InP compositions correspondingly.

Thus, a photodetector with extended wavelength range, improved responsivity and other improved characteristics is provided.

While the photodetector 10 of the first embodiment has the active region 16 including alternating compressive and tensile strain layers, alternative embodiments of the photodetector may include other layers or combination thereof provided that the effective strain of the active region is substantially balanced, the layers are substantially defect free and provide enough optical absorption.

While the photodetector described above is fabricated on a n-type substrate wafer, alternatively, a complimentary structure may be fabricated on a p-type wafer.

The tensile strain layers 24 of the photodetector 10 described above are fabricated of InGaAs composition with a substrate made of InP. In modifications to this embodiment, the tensile strain

TABLE 1

Compressive and tensile strain in $In_xGa_{1-x}As$ composition

| Tensile | | | | | Compressive | | | | |
|---|---|---|---|---|---|---|---|---|---|
| Composition InxGa1-xAs x | Lattice constant [Å] | Strain on InP % | Bandgap [eV] | Wavelength [nm] | Composition InxGa1-xAs x | Lattice constant [Å] | Strain on InP % | Bandgap [eV] | Wavelength [nm] |
| 0.530 | 5.86795 | −0.02% | 0.750 | 1.652 | 0.535 | 5.86998 | 0.01% | 0.74686 | 1.659 |
| 0.525 | 5.86593 | −0.06% | 0.756 | 1.638 | 0.540 | 5.87200 | 0.04% | 0.74375 | 1.666 |
| 0.520 | 5.86390 | −0.09% | 0.760 | 1.631 | 0.545 | 5.87403 | 0.08% | 0.74065 | 1.673 |
| 0.515 | 5.86188 | −0.13% | 0.763 | 1.624 | 0.550 | 5.87605 | 0.11% | 0.73758 | 1.680 |
| 0.510 | 5.85985 | −0.16% | 0.766 | 1.617 | 0.555 | 5.87808 | 0.15% | 0.73453 | 1.687 |
| 0.505 | 5.85783 | −0.20% | 0.769 | 1.611 | 0.560 | 5.88010 | 0.18% | 0.73151 | 1.694 |
| 0.500 | 5.85580 | −0.23% | 0.773 | 1.604 | 0.565 | 5.88213 | 0.22% | 0.72850 | 1.701 |
| 0.495 | 5.85378 | −0.27% | 0.776 | 1.597 | 0.570 | 5.88415 | 0.25% | 0.72552 | 1.708 |
| 0.490 | 5.85175 | −0.30% | 0.779 | 1.590 | 0.575 | 5.88618 | 0.29% | 0.72256 | 1.715 |
| 0.485 | 5.84973 | −0.34% | 0.783 | 1.583 | 0.580 | 5.88820 | 0.32% | 0.71963 | 1.722 |
| 0.480 | 5.84770 | −0.37% | 0.786 | 1.576 | 0.585 | 5.89023 | 0.35% | 0.71671 | 1.729 |
| 0.475 | 5.84568 | −0.40% | 0.789 | 1.570 | 0.590 | 5.89225 | 0.39% | 0.71382 | 1.736 |
| 0.470 | 5.84365 | −0.44% | 0.793 | 1.563 | 0.595 | 5.89428 | 0.42% | 0.71095 | 1.743 |
| 0.465 | 5.84163 | −0.47% | 0.796 | 1.556 | 0.600 | 5.89630 | 0.46% | 0.70811 | 1.750 |
| 0.460 | 5.83960 | −0.51% | 0.800 | 1.549 | 0.605 | 5.89833 | 0.49% | 0.70528 | 1.757 |
| 0.455 | 5.83758 | −0.54% | 0.803 | 1.542 | 0.610 | 5.90035 | 0.53% | 0.70248 | 1.764 |
| 0.450 | 5.83555 | −0.58% | 0.807 | 1.536 | 0.615 | 5.90238 | 0.56% | 0.69970 | 1.771 |
| 0.445 | 5.83353 | −0.61% | 0.810 | 1.529 | 0.620 | 5.90440 | 0.60% | 0.69695 | 1.778 |
| 0.440 | 5.83150 | −0.65% | 0.814 | 1.522 | 0.625 | 5.90643 | 0.63% | 0.69421 | 1.785 |
| 0.435 | 5.82948 | −0.68% | 0.818 | 1.516 | 0.630 | 5.90845 | 0.67% | 0.69150 | 1.792 |
| 0.430 | 5.82745 | −0.71% | 0.821 | 1.509 | 0.635 | 5.91048 | 0.70% | 0.68881 | 1.799 |
| 0.425 | 5.82543 | −0.75% | 0.825 | 1.502 | 0.640 | 5.91250 | 0.73% | 0.68615 | 1.806 |
| 0.420 | 5.82340 | −0.78% | 0.828 | 1.496 | 0.645 | 5.91453 | 0.77% | 0.68350 | 1.813 |
| 0.415 | 5.82138 | −0.82% | 0.832 | 1.489 | 0.650 | 5.91655 | 0.80% | 0.68088 | 1.820 |
| 0.410 | 5.81935 | −0.85% | 0.836 | 1.482 | 0.655 | 5.91858 | 0.84% | 0.67828 | 1.827 |
| 0.405 | 5.81733 | −0.89% | 0.840 | 1.476 | 0.660 | 5.92060 | 0.87% | 0.67571 | 1.834 |
| 0.400 | 5.81530 | −0.92% | 0.843 | 1.469 | 0.665 | 5.92263 | 0.91% | 0.67315 | 1.841 |
| 0.395 | 5.81328 | −0.96% | 0.847 | 1.463 | 0.670 | 5.92465 | 0.94% | 0.67062 | 1.848 |
| 0.390 | 5.81125 | −0.99% | 0.851 | 1.456 | 0.675 | 5.92668 | 0.98% | 0.66811 | 1.854 |
| 0.385 | 5.80923 | −1.03% | 0.855 | 1.450 | 0.680 | 5.92870 | 1.01% | 0.66563 | 1.861 | layers 24 may be made of Ge material with the structure of the photodetector being formed on InP substrate. This tends to extend the long wavelength operation range of the photodetector up to about 2200 nm. Other III–V, II–IV and IV semiconductor group materials, or combinations thereof, are also suitable to form the active region 16 and the substrate of the photodetector 10. With corresponding selection of the semiconductor materials, it is possible to extend the wavelength range up to 2200 nm and even further.

Conveniently, the thicknesses of the active region layers 22 and 24 are optimized to provide maximum optical absorption over the required wavelength range. In applications where high responsivity is not a major issue, the thicknesses of the layers may be optimized to provide a pre-determined optical absorption and consequently a pre-determined responsivity of the photodetector.

In the embodiment described above, compressive strain layers have higher absorption and higher thickness. Alternatively, it may be possible for some materials to provide higher absorption in tensile strain layers. Then it would be convenient to make the tensile strain layers of higher thickness to provide sufficient absorption within the active region.

The photodetector 10 of the first embodiment is a PIN photodetector, i.e. the detector having a p-n junction. It is also contemplated that in alternative embodiments, the photodetector may comprise other types of photodetectors, e.g. avalanche photodetector (APD), waveguide photodetector, metal-semiconductor-metal (MSM) photodetector, Shottky barrier photodetector, the above list being not exhaustive.

The described photodetector may be used in a variety applications, including telecommunications, lasers, medical applications, aerospace industry, astronomy, cryogenics, and being used for different purposes, e.g. as a receiver diode or back facet monitor.

In addition to the temperature range listed above, and with the corresponding selection of semiconductor materials, the photodetector 10 having the described structure is capable of operating in a wide range of temperatures, including cryogenic temperatures. The most popular ranges will include the following ones: from about 0° C. to about 70° C.; from about 0° C. to about −40° C.; from about −40° C. to about −85° C.

Figure 6:
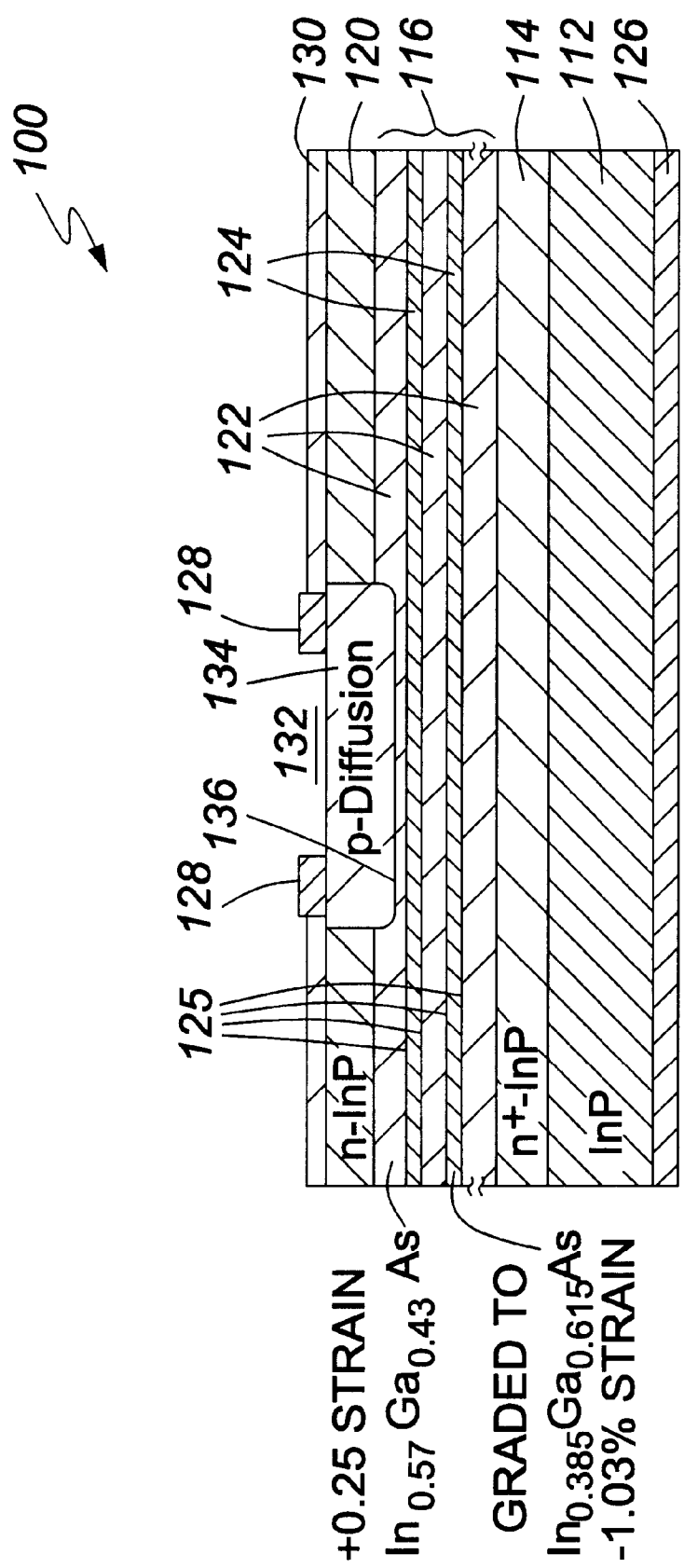
FIG. 6 is a schematic cross section through a photodetector according to a second embodiment of the invention.
Figure 7C:
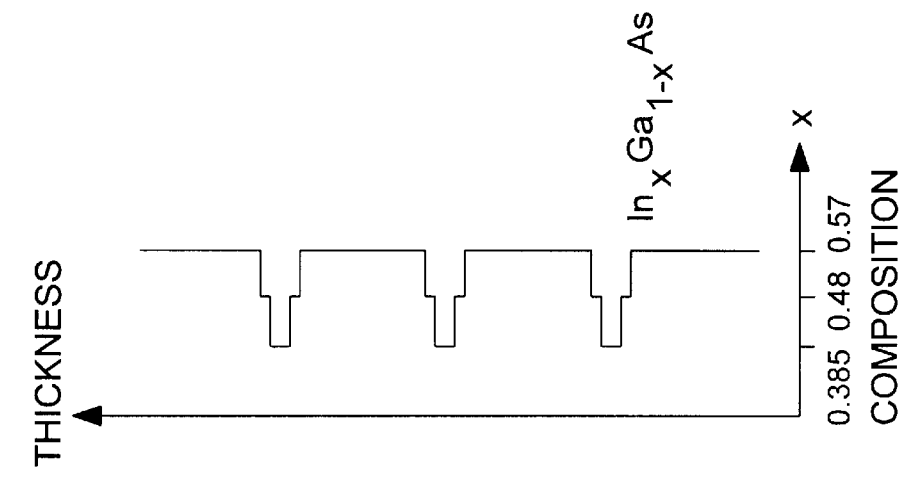
FIG. 7c illustrates step composition grading between the layers of the active region in the photodetector of FIG. 7a by introduction of an interstitial layer.
Figure 7B:
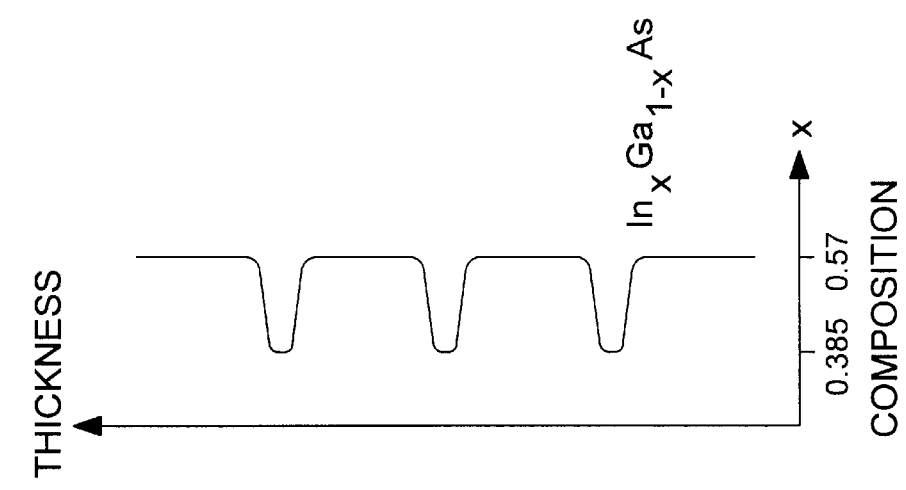
Figure 7A:
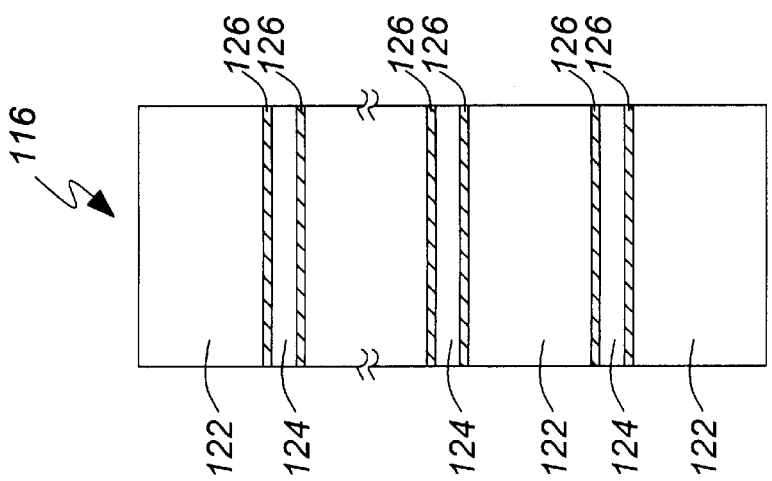
FIG. 7a is a schematic cross section through the active region of the photodetector of FIG. 6.

A photodetector 100 according to a second embodiment of the invention is schematically shown in FIG. 6. This photodetector is similar to that of shown in FIG. 1, and like elements are referred to by the same reference numerals incremented by 100, for example a substrate 112 providing a buffer layer 114 and an active region 116 (including compressive and tensile layers 122 and 124 respectively) followed by an overlying cap layer 120. The photodetector 100 of the second embodiment differs from that of the first embodiment in that interfaces 125 between the compressive strain layers 122 and tensile strain layers 124 are compositionally graded. The active region 116 is shown in more detail in FIG. 7a, with FIG. 7b illustrating continuous composition grading between the layers and FIG. 7c illustrating step grading. The continuous grading means that the composition "x" of In and Ga in $In_xGa_{1-x}As$ is gradually changed at the interfaces 125 between the layers. The grading is achieved by adjusting epitaxial growth conditions to vary the respective metallic mole fraction corresponding to "x" in $In_xGa_{1-x}As$. Step grading means that the composition "x" between the layers changes as a step function, as shown for example in FIG. 7c. This is done as follows. Before starting the growth of the next tensile 124 or compressive 122 type layer on top of the previous layer, one or more interstitial grade layers with intermediate composition "x" are introduced, the grade layers being thin in comparison to either bounding layer. FIG. 7c illustrates step grading performed by introduction of one grade layer 126 on each interface, the grade layer having thickness of about 1 nm and composition x approximately equal to 0.48.

Conversely, the grading can be performed at the interfaces following the tensile type layers 124 only. Alternatively, grading can be done at the interfaces following the compressive strain layers 122 only. Thickness and composition of the grading layers are taken into account to provide the total effective strain in the active layer equal substantially zero.

Other modifications similar to ones of the first embodiment listed above are also applicable to the second embodiment of the invention.

Thus, the optical photodetector having an extended wavelength range combined with high responsivity of the detectors and low defect concentration, resulting in low leakage currents, long lifetime of the photodetectors and high reliability is provided.

Although specific embodiments of the invention have been described in detail, it will be apparent to one skilled in the art that variations and modifications to the embodiments may be made within the scope of the following claims.

What is claimed is:

1. A photodetector, comprising:
   a) a substrate;
   b) an active region formed on the substrate, the active region comprising:
      a plurality of semiconductor layers, the thickness of each layer being limited to preclude formation of crystalline defects,
      a total effective strain for the active region being balanced, wherein the effective strain is defined as a product of strain by thickness of the layer,
      the thickness of at least one layer being different from thicknesses of other layers, the thicknesses of the layers being selected so as to provide a predetermined optical absorption over a required wavelength range; and
   c) means for providing depletion of the active region of electric charge carriers.

2. A photodetector of claim 1, wherein the thicknesses of the layers are selected so as to provide a maximum optical absorption over the required wavelength range.

3. A photodetector of claim 2 wherein the layers with higher optical absorption constant have higher thickness than the layers with lower optical absorption constant.

4. A photodetector of claim 1, wherein the active region comprises alternating layers, placed under compressive and tensile strain correspondingly, the layers with higher optical absorption constant having higher thickness than the layers with lower optical absorption constant.

5. A photodetector of claim 4, wherein the compressive strain layers have higher thickness than the tensile strain layers.

6. A photodetector of claim 4, wherein the tensile strain layers have higher thickness than the compressive strain layers.

7. A photodetector of claim 4, wherein the compressive and tensile strain layers are made of InGaAs composition.

8. A photodetector of claim 7, wherein the substrate is made of InP.

9. A photodetector of claim 7, the photodetector operating within a wavelength range from about 970 nm to about 1800 nm.

10. A photodetector of claim 1 or 4, wherein for each layer, a product of strain by thickness is not exceeding about 20% nm.

11. A photodetector of claim 4, wherein the compressive strain layers are made of InGaAs composition, and the tensile strain layers are made of Ge.

12. A photodetector of claim 11, wherein the substrate is made of InP.

13. A photodetector of claim 11, the photodetector operating within a wavelength range from about 970 nm to about 2000 nm.

14. A photodetector of claim 1 or 4, wherein the interfaces between the layers are compositionally graded by forming an interstitial grade layer.

15. A photodetector of claim 14, wherein the interfaces between the layers are graded by forming two or more interstitial grade layers.

16. A photodetector of claim 14, wherein the interfaces, following the compressive strain layers, are graded only.

17. A photodetector of claim 14, wherein the interfaces, following the tensile strain layers, are graded only.

18. A photodetector of claim 1 or 4, wherein means for providing depletion of the active region of electric charge carriers comprises electrical contacts for applying an electric field to the active region.

19. A photodetector of claim 18, wherein a cap layer is formed above the active region, the electrical contacts being provided to the cap layer and the substrate.

20. A photodetector of claim 1 or 4, the photodetector providing a long wavelength operation up to about 2200 nm.

21. A photodetector of claim 1 or 4, the photodetector being a PIN photodetector.

22. A photodetector of claim 1 or 4, the photodetector being an avalanche photodetector (APD).

23. A photodetector of claim 1 or 4, the photodetector being a waveguide photodetector.

24. A photodetector of claim 1 or 4, the photodetector being a metal-semiconductor-metal (MSM) photodetector.

25. A photodetector of claim 1 or 4, the photodetector being a Shottky barrier photodetector.

26. A photodetector of claim 1 or 4, the photodetector operating at about room temperatures.

27. A photodetector of claim 1 or 4, the photodetector operating above about room temperatures.

28. A photodetector of claim 27, the photodetector operating within a temperature range from about 0° C. to about −40° C.

29. A photodetector of claim 27, the photodetector operating within a temperature range from about −40° C. to about −85° C.

30. A photodetector of claim 1 or 4, the photodetector operating below about room temperatures.

31. A photodetector of claim 1 or 4, the photodetector operating at cryogenic temperatures.

32. A photodetector of claim 1 or 4, the photodetector operating within a temperature range from about 0° C. to about 70° C.

* * * * *